US012638977B2

(12) United States Patent
Li et al.

(10) Patent No.: US 12,638,977 B2
(45) Date of Patent: May 26, 2026

(54) DETERMINING DATA MIGRATION PRIORITIES IN A MEMORY SUB-SYSTEM

(71) Applicant: Micron Technology, Inc., Boise, ID (US)

(72) Inventors: Juane Li, San Jose, CA (US); Fanqi Wu, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/789,604

(22) Filed: Jul. 30, 2024

(65) Prior Publication Data

US 2026/0037135 A1     Feb. 5, 2026

(51) Int. Cl.
| | |
|---|---|
| *G06F 3/00* | (2006.01) |
| *G06F 3/06* | (2006.01) |
| *G06F 11/00* | (2006.01) |
| *G06F 11/10* | (2006.01) |
| *G11C 29/00* | (2006.01) |
| *G11C 29/44* | (2006.01) |

(52) U.S. Cl.
CPC .......... *G06F 3/0613* (2013.01); *G06F 3/0647* (2013.01); *G06F 3/0679* (2013.01); *G06F 11/102* (2013.01); *G11C 29/44* (2013.01)

(58) Field of Classification Search
CPC .... G06F 11/102; G06F 3/0613; G06F 3/0647; G11C 29/44
See application file for complete search history.

(56) References Cited

U.S. PATENT DOCUMENTS

| | | | | |
|---|---|---|---|---|
| 8,503,257 | B2 * | 8/2013 | Post ................... | G11C 16/3418 |
| | | | | 365/201 |
| 2005/0050410 | A1 * | 3/2005 | Pomaranski .......... | G11C 29/56 |
| | | | | 714/723 |
| 2017/0132125 | A1 * | 5/2017 | Cai ..................... | G06F 12/0261 |
| 2021/0319834 | A1 * | 10/2021 | Sharifi Tehrani .... | G11C 7/1045 |
| 2021/0357128 | A1 * | 11/2021 | Cha ...................... | G06F 3/0679 |
| 2022/0092025 | A1 * | 3/2022 | Vaideeswaran ....... | G06F 3/0619 |

OTHER PUBLICATIONS

Han et al., Page Type-Aware Data Migration Technique for Read Disturb Management of NAND Flash Memory, Feb. 8, 2023, IEEE, pp. 1-4 (Year: 2023).*

* cited by examiner

*Primary Examiner* — Reginald G Bragdon
*Assistant Examiner* — Michael L Westbrook
(74) *Attorney, Agent, or Firm* — Lowenstein Sandler LLP

(57) ABSTRACT

Various aspects of the present disclosure relate to determining data migration priorities in a memory sub-system. A processing device performs a scan operation, such as a read disturb scan, to detect one or more errors in a memory block of the plurality of memory blocks. The processing device determines, based on a result of the scan operation, to perform a data migration operation to move data from one or more memory segments of the memory device to one or more other memory segments of the memory device, wherein the one or more memory segments of the memory device include at least one page of the memory block. The processing logic determines a corresponding priority level of the data migration operation. The processing logic performs the data migration operation based on the corresponding priority level.

19 Claims, 5 Drawing Sheets

410 Perform a scan operation to detect one or more errors in a memory block of a plurality of memory blocks 420 Determine, based on a result of the scan operation, to perform a data migration operation to move data from one or more memory segments of the memory device 430 Determine a corresponding priority level of the data migration operation 440 Perform the data migration operation based on the corresponding priority level

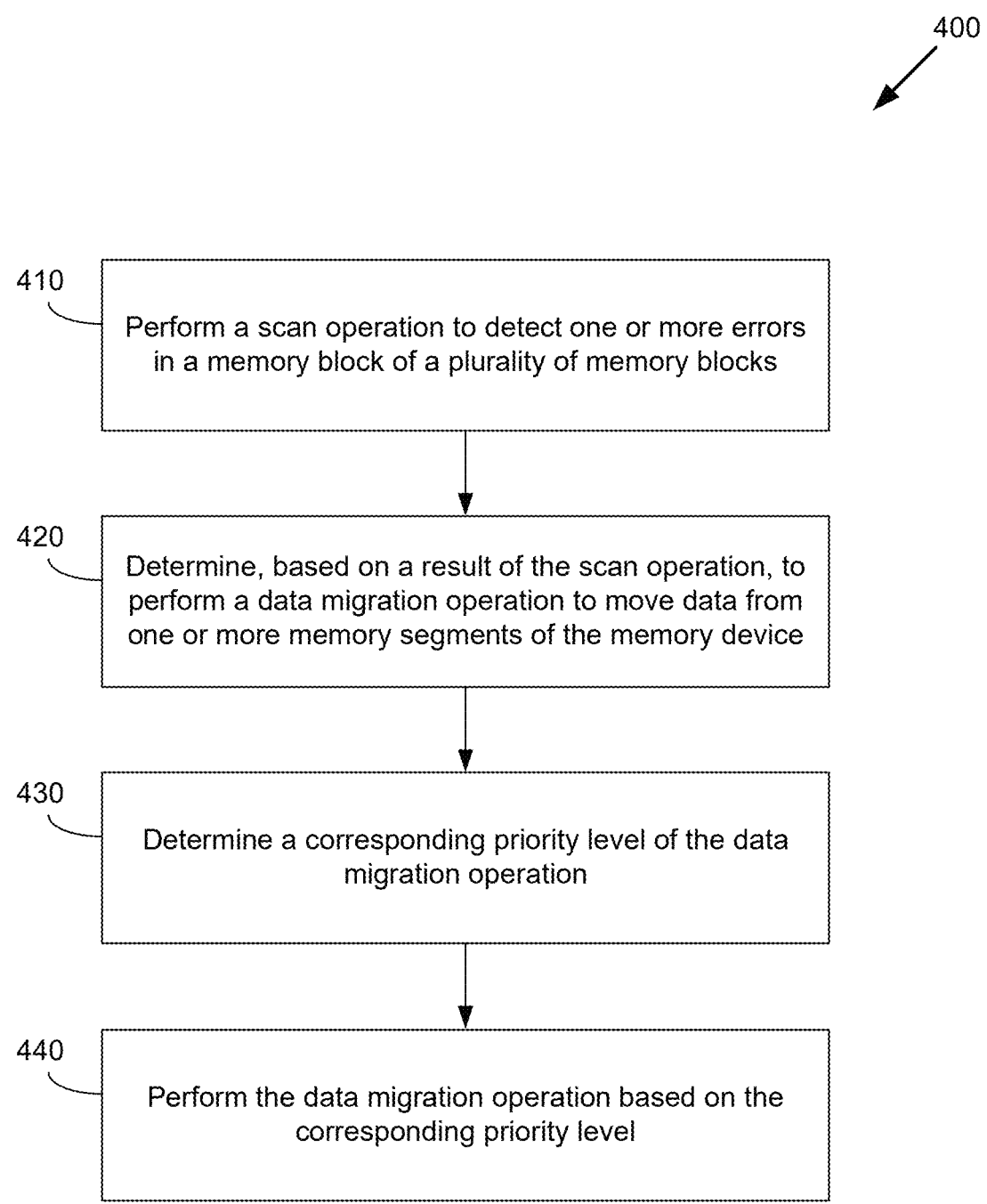

400

410 — Perform a scan operation to detect one or more errors in a memory block of a plurality of memory blocks 420 — Determine, based on a result of the scan operation, to perform a data migration operation to move data from one or more memory segments of the memory device 430 — Determine a corresponding priority level of the data migration operation 440 — Perform the data migration operation based on the corresponding priority level

FIG. 4

DETERMINING DATA MIGRATION PRIORITIES IN A MEMORY SUB-SYSTEM

TECHNICAL FIELD

Aspects of the disclosure relate generally to memory sub-systems, and more specifically, to determining data migration priorities in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various aspects of the disclosure.

FIG. 4 is a flow diagram of an example method of determining data migration priorities in a memory sub-system, in accordance with some aspects of the present disclosure.

DETAILED DESCRIPTION

Figure 1:
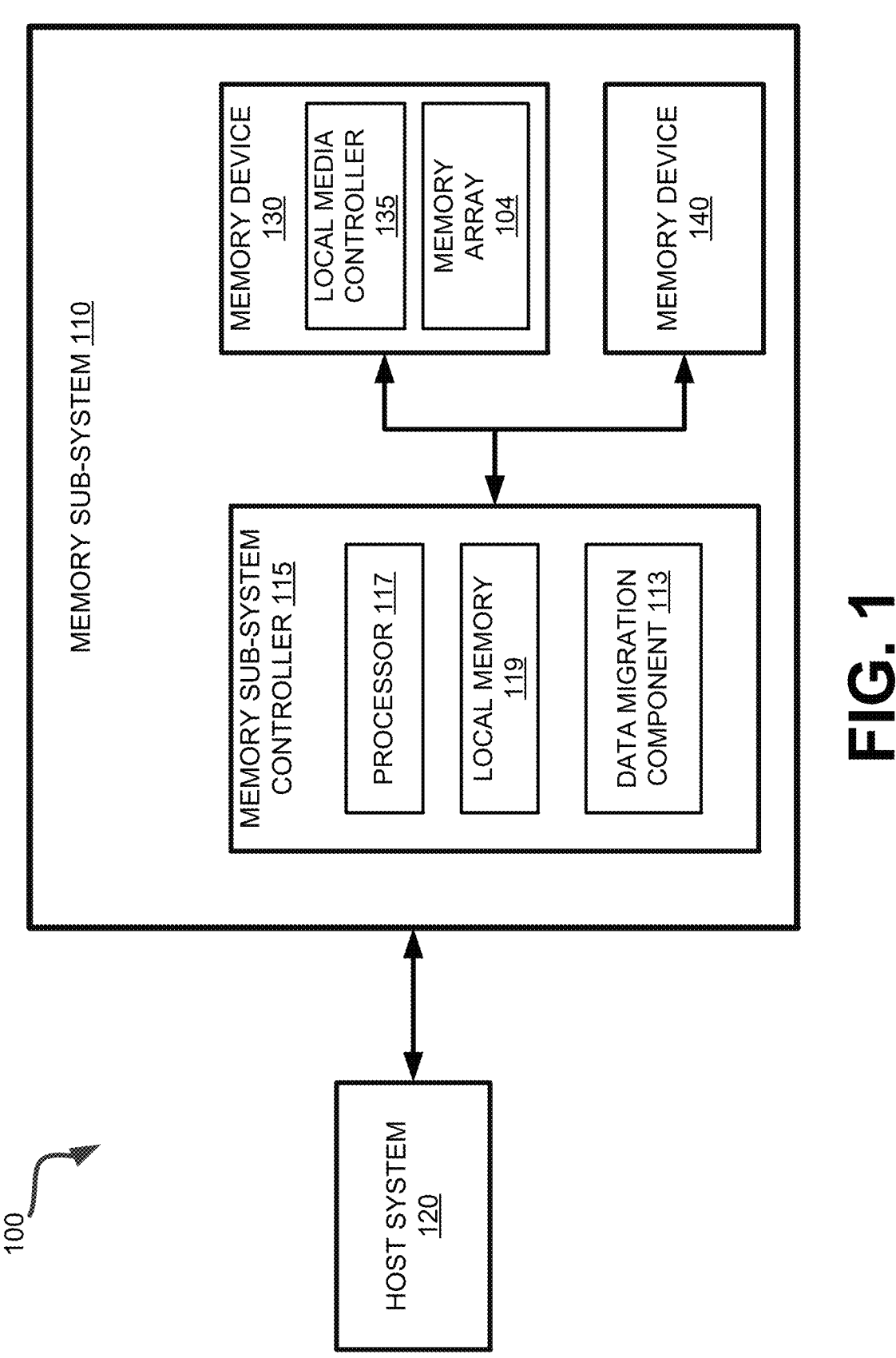
FIG. 1 illustrates an example computing system that includes a memory sub-system, in accordance with some aspects of the present disclosure.

Aspects of the present disclosure are directed to determining data migration priorities in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIG. 1. A non-volatile memory device is a package of one or more dies. Each die can include one or more planes. For some types of non-volatile memory devices (e.g., NAND devices), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or a three-dimensional grid. Memory cells are formed onto a silicon wafer in a rectangular array; the memory cells may be joined by conductive lines referred to as wordlines and bitlines. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For case of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A processing device can scan a memory device to detect potential errors or defects in the memory cells of the memory device. The scan operation can include an error checking routine that reads and verifies the data stored in the memory cells to ensure that the data matches expected values. In some cases, the scan operation can be performed in a background of the memory device while the memory device is in use. Unlike other types of scans, which may be initiated manually or during maintenance processes of the memory device, a background scan can operate without significantly impacting the read and write performance of the memory device while efficiently and effectively checking for signs of wear, degradation, or errors in the memory cells. One example of a memory device scan operation is a read disturb scan.

Read disturb refers to an occurrence where repeatedly reading from a particular memory cell causes unintended changes in the data stored in nearby cells. When a memory cell is read frequently, the electrical charges in adjacent cells can be altered due to the stress caused by repeated access. Over time, this can lead to data corruption in the affected cells. One example type of memory device scanning is a read disturb scan. A read disturb scan is a process used in memory systems to detect and mitigate the adverse effects of read disturb. The scan can begin by identifying memory blocks or pages with high read counts, for example, based on read counter tracking and thresholds. Once a target block is identified for the read disturb scan, the data may be backed up to prevent data loss, and a memory controller may switch the memory device to a diagnostic mode for enhanced accuracy. The scan may include sequential read operations on the target block to simulate normal access patterns, followed by error detection using error-correcting code (ECC) or other error detection mechanisms. Errors may be counted and analyzed to determine their extent and pattern, revealing the impact of the read disturb. Upon detecting the errors, corrective actions may be taken, such as refreshing the data in the affected cells by reading and rewriting to restore correct charge levels, or re-allocating severely affected blocks by marking them as bad blocks and relocating the data within the bad blocks, among other examples. Wear leveling adjustments may also be made to distribute read operations more evenly across the memory device. After these corrections, an integrity check can be performed to ensure that the data is correctly restored. Read disturb scans may help to improve data integrity, extend a lifespan of the memory device, and ensure reliable data storage by continuously monitoring and addressing the effects of frequent read operations.

In some cases, a read disturb scan can involve scanning one or more blocks of the memory device, where each block is associated with an individual read counter that monitors how often the block has been read. This may enable highly accurate error detection. However, maintaining individual counters for each block of the memory device can be resource-intensive and may negatively impact memory system performance. In some other cases, read disturb scanning can include performing probabilistic read disturb scans, where a single read counter is assigned and maintained for each die (rather than for each block). This approach reduces the number of counters to be managed by the memory system, thereby conserving memory system resources. When a shared read counter for the die reaches a certain threshold, the memory system identifies a victim block. A victim block is a block that is selected for further evaluation or action based on the usage of the block and the potential impact of the read disturb on the block. The selection of the victim block is performed probabilistically, meaning that the selection is based on certain probability-based criteria rather than a fixed sequence or pattern. This improves a likelihood that the system can efficiently monitor and manage the blocks without needing to track each block individually.

Once the victim block is selected during the read disturb scan, the memory system examines specific pages within that block. Each page may have an attribute referred to as a bit error count (BEC). The BEC indicates the number of errors detected in the data bits of that page. The BEC helps in assessing the reliability and integrity of the stored data, especially in the context of read disturb effects. During the scan, the system compares the BEC of these pages against a BEC threshold. If the BEC of the page satisfies this threshold, the data integrity is considered to be at risk due to read disturb, meaning that the likelihood of errors is high. In this case, the memory system may initiate a refresh operation for the entire block. A refresh operation, which may be, or may include, a data migration operation, involves moving the data from the affected data block to a different, more reliable data block. This process assists in preserving data integrity by ensuring that data is not stored in blocks that have a high probability of errors due to read disturb effects. The refresh operation may involve copying the data to a new block with a lower BEC or a block that has been subjected to fewer read cycles. An urgent refresh operation, which may be referred to as an urgent data migration operation, may be necessary when the BEC reaches critical levels faster than anticipated, necessitating immediate action to prevent data loss.

Urgent refresh operations may result in performance drops within the memory system. During urgent refresh operations, system resources (such as CPU cycles and memory bandwidth) may be diverted from regular memory device operations to handle the immediate refresh tasks. This diversion can slow down ongoing processes and reduce overall system throughput. Additionally, urgent refresh operations may involve moving large amounts of data from the affected block to a new location. This data movement can consume significant bandwidth, potentially causing delays in standard read and write operations that rely on the same channels. Further, the urgent nature of the refresh process may introduce latency into the memory system. Standard read and write operations may experience delays as the system prioritizes the refresh tasks to ensure data integrity, leading to slower response times for user requests. Even further, urgent folding can disrupt normal workflows and data access patterns. Applications relying on timely data retrieval may experience interruptions or slower performance, affecting overall user experience and productivity.

Aspects of the present disclosure address the above and other deficiencies by implementing a memory sub-system for determining data migration priorities. A processing device, such as a memory sub-system controller associated with the memory sub-system, may perform a scan operation to detect one or more errors in a memory block of the memory device. In some aspects, the scan operation is a read disturb scan operation. The processing device may determine, based on a result of the scan operation, to perform a data migration operation to move data from one or more memory segments of the memory device to one or more other memory segments of the memory device. The one or more memory segments of the memory device may include one or more pages of the memory block or one or more wordlines of the memory block. The processing device may determine a corresponding priority level of the data migration operation. For example, the processing device may determine whether the data migration operation is a high priority data migration operation or a low priority data migration operation. The high priority data migration operation may be performed for a first set of memory segments of the memory block that failed the scan operation. Alternatively, the low priority data migration operation may be performed for a remaining set of memory segments of the memory block that did not fail the scan operation. The processing device may perform the data migration operation based on the corresponding priority level of the one or more memory segments. For example, the processing device may initiate the high priority data migration operation at a first time and may initiate the low priority data migration operation at a second time that is later than the first time.

Some advantages of the present disclosure include enabling priorities for memory device data migration operations. For example, some advantages of the present disclosure enable certain types of data migration operations to be performed within a shorter time period based on a high priority characteristic of the data migration, while enabling other types of data migration operations to be performed within a longer time period based on a lower priority characteristic of the data migration. Some advantages of the present disclosure include urgent data migration operations, associated with memory device segments having a degradation characteristic that is greater than a degradation threshold, to be assigned a higher priority, while enabling other types of data migration operations, associated with memory device segments having degradation characteristics that are lower than the degradation threshold, to be assigned a lower priority (and therefore, to be performed after the high priority data migration operations). Some advantages of the present disclosure include reducing memory device performance drops during data migration operations. Some advantages of the present disclosure include reducing bandwidth usage by data migration operations in the memory system. Some advantages of the present disclosure include reducing latency caused by data migration operations in the memory system. Some advantages of the present disclosure include reducing disruptions to standard read and write operations caused by the data migration operations. These example advantages, among others, are described in more detail below.

FIG. 1 illustrates an example computing system 100 that includes a memory sub-system 110, in accordance with some aspects of the present disclosure. The memory sub-system 110 can include media, such as one or more volatile memory devices (e.g., memory device 140), one or more non-volatile memory devices (e.g., one or more memory device(s) 130), or a combination of such.

The memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some aspects, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130)

when the memory sub-system 110 is coupled with the host system 120 by the physical host interface (e.g., PCIe or CXL interface). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some aspects, each of the memory devices 130 can include one or more arrays of memory cells such as SLCs, MLCs, TLCs, QLCs, or any combination of such. In some aspects, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some aspects, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in some other aspects, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some aspects, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some aspects, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some aspects, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some aspects, one or more components of memory sub-system 110 can be omitted.

In some aspects, the memory sub-system 110 includes a data migration component 113 that can be used to determine data migration priorities. The data migration component 113 may perform a scan operation to detect one or more errors in a memory block of the memory device. The scan operation may be a read disturb scan operation. The data migration component 113 may determine, based on a result of the scan operation, to perform a data migration operation to move data from one or more memory segments of the memory device to one or more other memory segments of the memory device. The one or more memory segments of the memory device may include one or more pages of the memory block. The data migration component 113 may determine a corresponding priority level of the data migration operation. For example, the data migration component 113 may determine whether the data migration operation is a high priority data migration operation or a low priority data migration operation. The high priority data migration operation may be performed for a first set of memory segments of the memory block that failed the scan operation. Alternatively, the low priority data migration operation may be performed for a remaining set of memory segments of the memory block that did not fail the scan operation. The data migration component 113 may perform the data migration operation based on the corresponding priority level of the one or more memory segments. Additional details regarding these features are described below.

Figure 2:
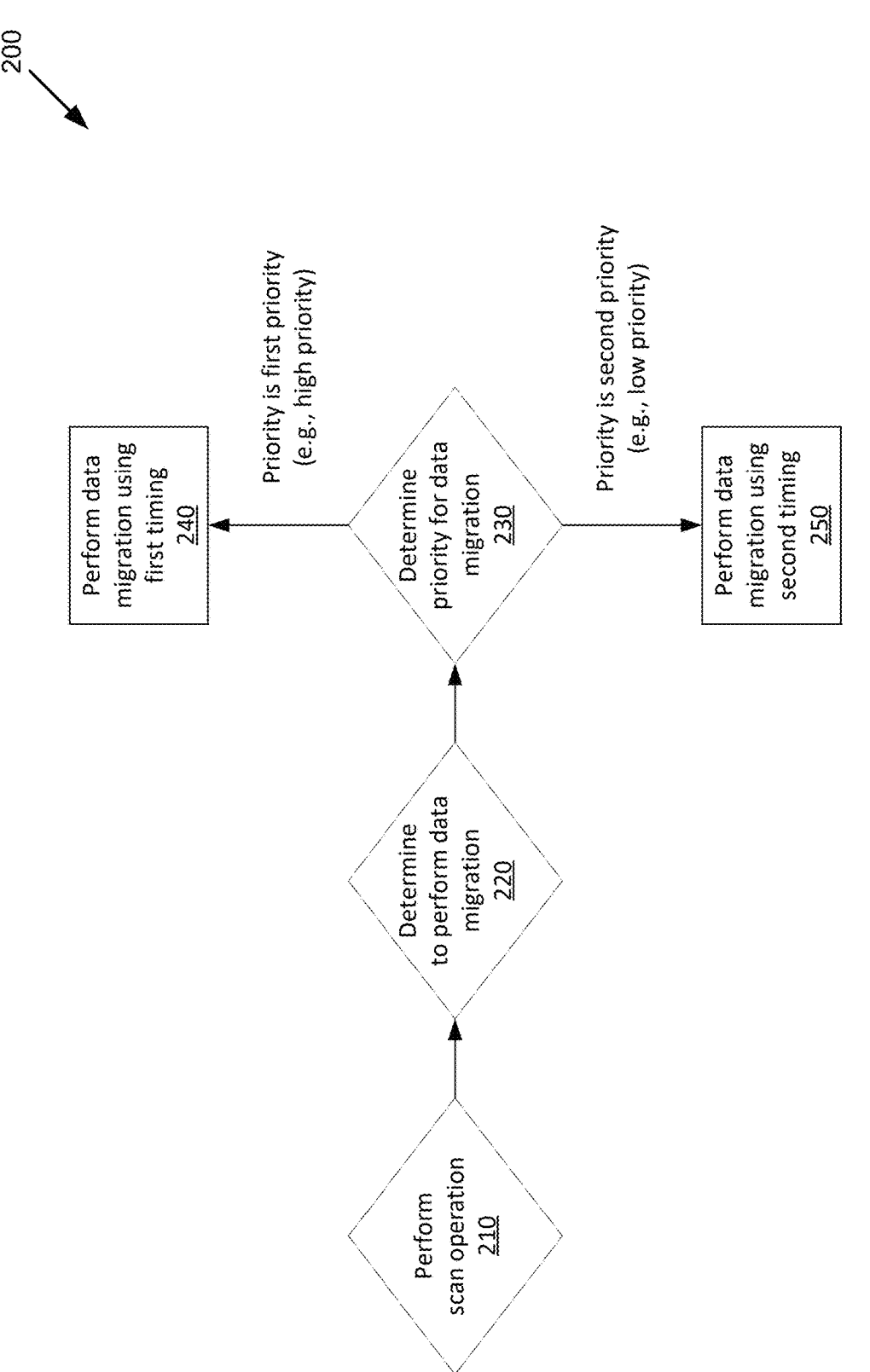
FIG. 2 is a sequence diagram illustrating an example method of determining data migration priorities in a memory sub-system, in accordance with some aspects of the present disclosure.

FIG. 2 is a sequence diagram illustrating an example method 200 of determining data migration priorities in a memory sub-system, in accordance with some aspects of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some aspects, the method 200 is performed by the data migration component 113 of FIG. 1. Although shown in a particular sequence or order, unless otherwise specified, the order of the processes can be modified. Thus, the illustrated aspects should be understood only as examples, and the illustrated processes can be performed in a different order, and some processes can be performed in parallel. Additionally, one or more processes can be omitted in various aspects. Thus, not all processes are required in every aspect. Other process flows are possible.

At operation 210, the processing logic performs a scan operation. The scan operation can be used to detect potential errors or defects in the memory cells of the memory device. The scan operation can be performed in a background of the memory device while the memory device is in use, which may enable the scan operation to be performed without impacting (or without significantly impacting) the read and write performance of the memory device.

In some aspects, the scan operation is a read disturb scan. A read disturb scan is a process used in memory systems to detect and mitigate the adverse effects of read disturb, where read disturb is an unintended change in one or more memory cells of the memory device resulting from high quantities of read operations performed on adjacent (e.g., neighboring) memory cells of the one or more memory cells. A read disturb scan may begin by identifying memory blocks with high read counts, for example, using read counter tracking and corresponding thresholds. Additionally, the read disturb scan may include performing sequential read operations on a target block to simulate normal access patterns, and subsequently performing error detection using ECC or other error detection mechanisms. Errors may then be counted and analyzed to determine their extent and pattern, revealing the impact of the read disturb.

In some aspects, the read disturb scan is a probabilistic read disturb scan. A probabilistic read disturb scan is a read disturb scan that assigns and maintains a single counter for each die of the memory device. When the shared read counter for a die of the memory device reaches a certain threshold, the memory system identifies a victim block of the memory device. The victim block is a block that is selected for further evaluation or action based on the usage of the block and the potential impact of the read disturb on the block. The selection of the victim block may be performed probabilistically, meaning that the selection is based on certain probability-based criteria rather than a fixed sequence or pattern. Once the victim block is selected, the processing logic may examine specific pages within the victim block. Each page may have a BEC that indicates the number of errors detected in the data bits of that page. The processing logic may compare the BEC of these pages against a BEC threshold. If the BEC of the page satisfies this threshold, the data integrity is considered to be at risk due to read disturb, meaning that the likelihood of errors is high. In this case, the processing logic may initiate a data migration operation for the entire block.

At operation 220, the processing logic determines to perform the data migration operation. The data migration operation may be used to move data from one or more memory segments of the memory device to one or more other memory segments of the memory device. For example, the processing logic may determine to move data from one or more pages of the memory device to one or more other pages of the memory device, or from one or more wordlines of the memory device to one or more other wordlines of the memory device. As described above, in some aspects, the processing logic may determine to perform the data migration operation based on a BEC count of the one or more pages of the memory block, or the one or more wordlines of the memory block, satisfying a BEC threshold (e.g., being greater than or equal to the BEC threshold).

At operation 230, the processing logic determines a priority for the data migration operation. In some aspects, determining the priority for the data migration operation may include determining whether the data migration operation is to be performed using a first priority or a second priority. However, any number of priorities, or any types of priorities, may be used by the processing logic for moving the data from the one or more memory segments to the one or more other memory segments.

In some aspects, the first priority may be associated with a high priority data migration and the second priority may be associated with a low priority data migration. The high priority data migration may be performed for a first set of memory segments of the memory block and the low priority data migration operation may be performed for a remaining set of memory segments of the memory block. For example, the high priority data migration may be performed for a first set of memory segments of the memory block that failed the scan operation and the low priority data migration operation may be performed for a remaining set of memory segments of the memory block that did not fail the scan operation.

At operation 240, the processing logic performs the data migration using first timing. The processing logic may perform the data migration operation using the first timing responsive to determining that the priority for the data migration is the first priority, such as the high priority. In some aspects, the processing logic may move data from the first set of memory segments of the memory block, such as the pages or wordlines that failed the read disturb scan, to the one or more other memory segments, using the first timing. In some aspects, the first timing may be immediately after a completion of the read disturb scan, or shortly after (for example, within three seconds of) the completion of the read disturb scan. Therefore, the processing logic may initiate the data migration for the first set of memory segments immediately after the completion of the read disturb scan or shortly after the completion of the read disturb scan.

At operation 250, the processing logic performs the data migration using second timing. The processing logic may perform the data migration operation using the second timing responsive to determining that the priority for the data migration is the second priority, such as the low priority. In some aspects, the second timing is longer than the first timing. For example, the second timing may be set to a certain time period (for example, ten minutes after the read disturb scan is complete). Therefore, the processing logic may initiate the data migration for the second set of memory segments after the time period has passed, such as ten minutes after the read disturb scan is complete.

In some aspects, the processing logic may maintain a read counter per block stripe while performing the data migration using the second timing. If the read counter per block stripe satisfies a rate threshold (for example, is greater than or equal to the rate threshold), the processing logic may switch to performing the data migration operation using the first timing. This may reduce a likelihood of data integrity issues within the memory cell of the memory device.

Figure 3:
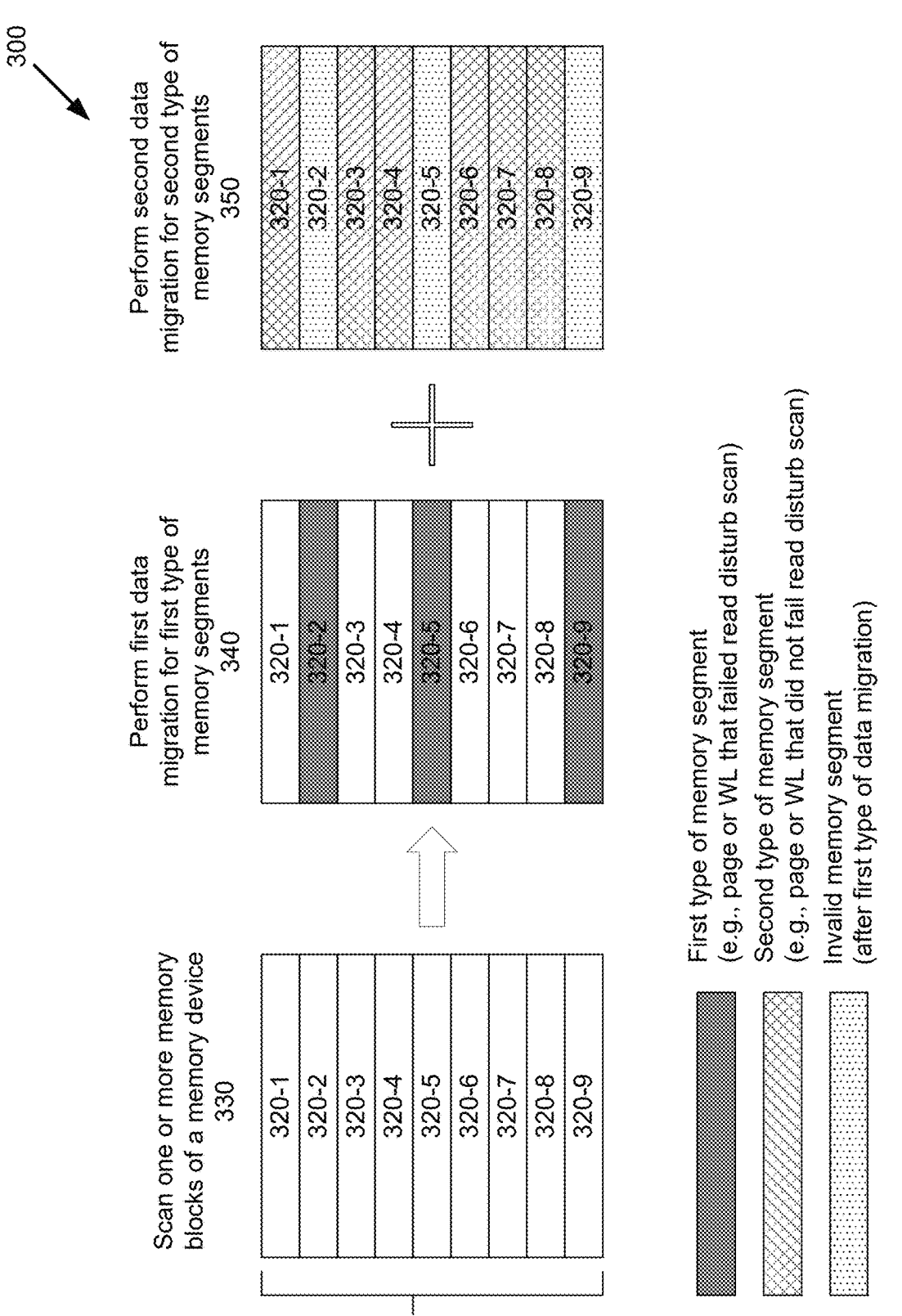
FIG. 3 is a sequence diagram illustrating an example method of performing high priority data migration operations and low priority data migration operations, in accordance with some aspects of the present disclosure.

FIG. 3 is a sequence diagram illustrating an example method 300 of performing high priority data migration operations and low priority data migration operations, in accordance with some aspects of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some aspects, the method 300 is performed by the data migration component 113 of FIG. 1. Although shown in a particular sequence or order, unless otherwise specified, the order of the processes can be modified. Thus, the illustrated aspects should be understood only as examples, and the illustrated processes can be performed in a different order, and some processes can be performed in parallel. Additionally, one or more processes can be omitted in various aspects. Thus, not all processes are required in every aspect. Other process flows are possible.

As described herein, a memory device includes a plurality of memory blocks. Each memory block of the plurality of memory blocks may include one or more memory segments. The memory segments may be, or may include, one or more pages of the memory block or one or more wordlines of the memory block. As shown in the example 300, a memory block 310 may include a plurality of memory segments 320. While the memory block 310 is shown as having nine memory segments 320 (labeled as 320-1 through 320-9, respectively), the memory block 310 may include any number of memory segments 320.

At operation 330, the processing logic scans one or more memory blocks of the memory device. In some aspects, to scan the one or more memory blocks of the memory device, the processing logic performs a read disturb scan as described, for example, at operation 210 of FIG. 2.

At operation 340, the processing logic performs a first data migration for a first type of memory segments. The first type of memory segments may include one or more pages of the memory block or one or more wordlines of the memory block that failed the read disturb scan. In some aspects, the first data migration may be referred to as a high priority data migration operation. The first data migration may be performed using first timing. For example, the first data migration may be initiated by the processing logic timing may be immediately after a completion of the read disturb scan, or shortly after (for example, within three seconds of) the completion of the read disturb scan. As shown in example 300, the processing logic may determine that memory segments 320-2, 320-5 and 320-9 failed the read disturb scan. Therefore, the processing logic may perform the first data migration operation for the memory segments 320-2, 320-5 and 320-9 using the first timing (such as within three seconds of the completion of the read disturb scan).

At operation 350, the processing logic performs a second data migration for a second type of memory segments. The second type of memory segments may include one or more pages of the memory block or one or more wordlines of the memory block that did not fail the read disturb scan (e.g., the passed the read disturb scan). In some aspects, the second data migration may be referred to as a low priority data migration operation. The second data migration may be performed using second timing that is longer than the first timing. For example, the second data migration may be initiated ten minutes after an end of the read disturb scan. As shown in example 300, the processing logic may determine that memory segments 320-1, 320-3, 320-4, 320-6, 320-7 and 320-8 passed the read disturb scan. Therefore, the processing logic may perform the second data migration operation for the memory segments 320-1, 320-3, 320-4, 320-6, 320-7 and 320-8 using the second timing (such as ten minutes after the completion of the read disturb scan).

In some aspects, the first set of memory segments (such as memory segments 320-2, 320-5 and 320-9) degrade more quickly than the second set of memory segments (such as memory segments 320-1, 320-3, 320-4, 320-6, 320-7 and 320-8). Therefore, the second set of memory segments may be able to tolerate more stress, enabling the processing logic to move data from the second set of memory segments at a slower rate without sacrificing data integrity.

FIG. 4 is a flow diagram of an example method 400 of determining data migration priorities in a memory subsystem, in accordance with some aspects of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some aspects, the method 400 is performed by the data migration component 113 of FIG. 1. Although shown in a particular sequence or order, unless otherwise specified, the order of the processes can be modified. Thus, the illustrated aspects should be understood only as examples, and the illustrated processes can be performed in a different order, and some processes can be performed in parallel. Additionally, one or more processes can be omitted in various aspects. Thus, not all processes are required in every aspect. Other process flows are possible.

At operation 410, the processing logic performs a scan operation to detect one or more errors in a memory block of a plurality of memory blocks of the memory device. In some implementations, the scan operation is a read disturb scan operation. In some implementations, the processing device performs the read disturb scan operation based on determining that a read count of the memory device is greater than or equal to a read count threshold. In some implementations, the data migration operation is a data folding operation.

At operation 420, the processing logic determines, based on a result of the scan operation, to perform a data migration operation to move data from one or more memory segments of the memory device to one or more other memory segments of the memory device. In some implementations, the one or more memory segments of the memory device include a page of the memory block or a wordline of the memory block. In some implementations, to determine the corresponding priority level of the data migration operation, the processing logic determines whether the data migration operation is a high priority data migration operation or a low priority data migration operation. In some implementations, the high priority data migration operation is performed for a first set of memory segments of the memory block that failed the scan operation and the low priority data migration operation is performed for a remaining set of memory segments of the memory block that did not fail the scan operation. In some implementations, the processing device is further configured to switch from performing the low priority data migration operation to performing the high priority data migration operation based detecting that a read count of the memory block is greater than or equal to a read count threshold.

At operation 430, the processing logic determines a corresponding priority level of the data migration operation. In some implementations, to determine to perform the data migration operation to move the data from the one or more memory segments of the memory device to the one or more other memory segments of the memory device, the processing logic determines to perform the data migration operation based on a bit error count of the one or more memory segments being greater than or equal to a bit error count threshold.

At operation 440, the processing logic performs the data migration operation based on the corresponding priority level. In some implementations, the high priority data migration operation is initiated at a first time and the low priority data migration operation is initiated at a second time that is later than the first time. In some implementations, to perform the data migration operation based on the corresponding priority level, the processing logic is configured to initiate the data migration operation immediately after a completion of the scan operation based on determining that the corresponding priority level is greater than a priority level threshold. In some implementations, to perform the data migration operation based on the corresponding priority level, the processing logic is configured to initiate the data migration operation at a configured time after the data migration operation based on determining that the corresponding priority level is less than a priority level threshold. In some implementations, to perform the data migration operation based on the corresponding priority level, the processing logic is configured to initiate the data migration operation based on the memory device performing a number of read or write operations that is less than an operation number threshold based on determining that the corresponding priority level is less than a priority level threshold.

In some implementations, a non-transitory computer-readable storage medium comprises instructions that, when executed by a processing device, cause the processing device to perform one or more operations of the method 400.

Figure 5:
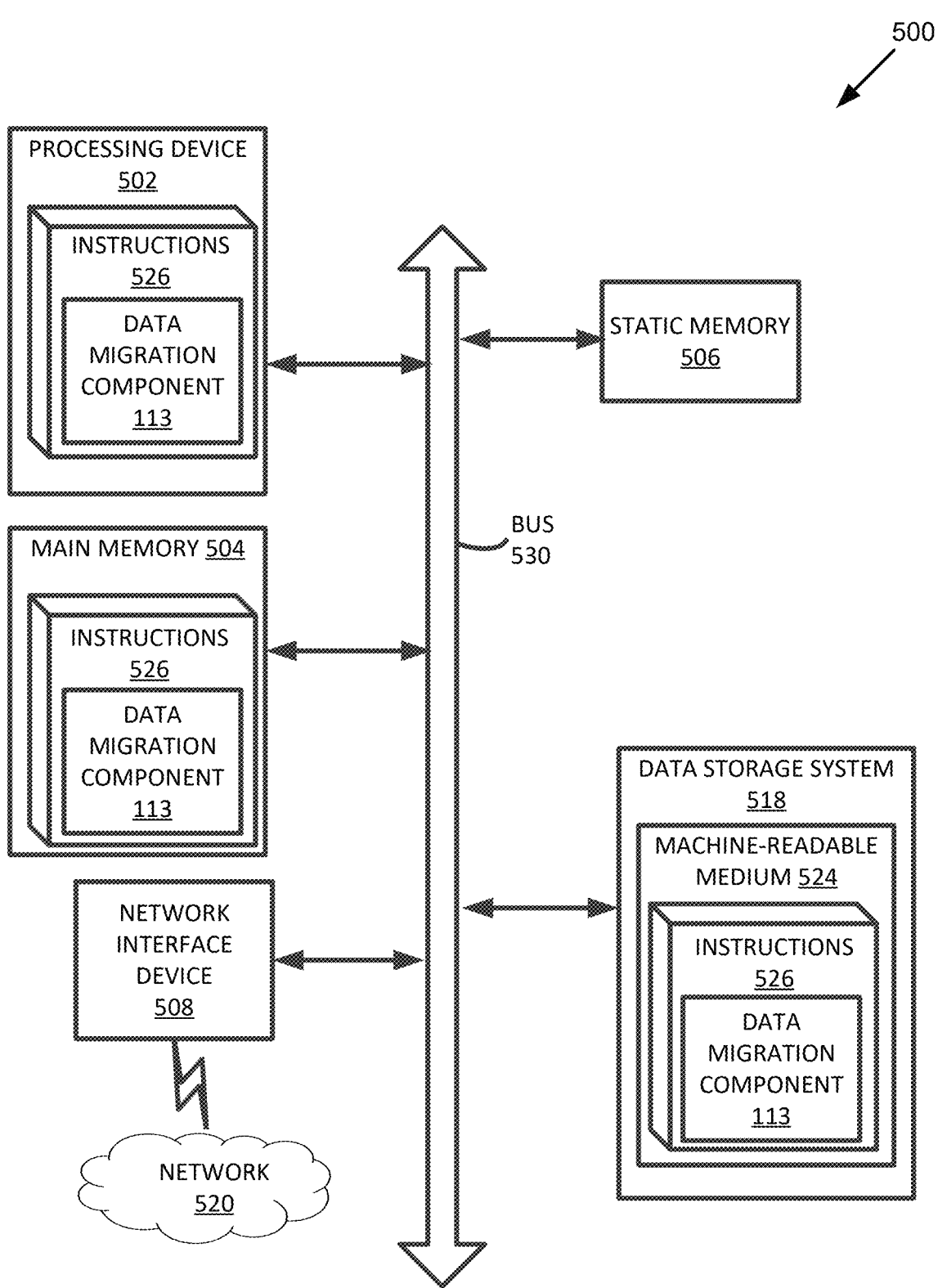
FIG. 5 is a block diagram of an example computer system in which some aspects of the present disclosure may operate.

FIG. 5 illustrates an example machine of a computer system 500 within which a set of instructions, for causing the machine to perform any one or more of the methodologies discussed herein, can be executed. In some aspects, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data migration component 113 of FIG. 1). In alternative aspects, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In some aspects, the instructions 526 include instructions to implement functionality corresponding to the data migration component 113 of FIG. 1). While the machine-readable storage medium 524 is shown in an example aspect to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some aspects, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, aspects of the disclosure have been described with reference to specific example aspects thereof. It will be evident that various modifications can be made thereto without departing from the broader spirit and scope of aspects of the disclosure as set forth in the following claims. The specification and drawings are, accordingly, to be regarded in an illustrative sense rather than a restrictive sense.

What is claimed is:

1. A system comprising:

a memory device comprising a plurality of memory blocks; and a processing device, coupled with the memory device, configured to perform operations comprising:

performing a scan operation to detect one or more errors in a memory block of the plurality of memory blocks;

determining, based on a result of the scan operation, to perform a data migration operation to move data from one or more memory segments of the memory device to one or more other memory segments of the memory device, wherein the one or more memory segments of the memory device include at least one page of the memory block;

determining a corresponding priority level of a plurality of different priority levels of the data migration operation, wherein each of the plurality of different priority levels have different associated timings; and performing the data migration operation with a first timing based on the corresponding priority level when the memory device has performed fewer than a predetermined number of read or write operations, wherein the predetermined number is based on the corresponding priority level.

2. The system of claim 1, wherein the scan operation is a read disturb scan operation.

3. The system of claim 2, wherein the processing device performs the read disturb scan operation based on determining that a read count of the memory device is greater than or equal to a read count threshold.

4. The system of claim 1, wherein the processing device, to determine the corresponding priority level of the data migration operation, determines whether the data migration operation is a high priority data migration operation or a low priority data migration operation, wherein the high priority data migration operation is initiated at a first time and the low priority data migration operation is initiated at a second time that is later than the first time.

5. The system of claim 4, wherein the high priority data migration operation is performed for a first set of memory segments of the memory block that failed the scan operation and the low priority data migration operation is performed for a remaining set of memory segments of the memory block that did not fail the scan operation.

6. The system of claim 4, wherein the processing device is further configured to switch from performing the low priority data migration operation to performing the high priority data migration operation based on detecting that a read count of the memory block is greater than or equal to a read count threshold.

7. The system of claim 1, wherein the processing device, to perform the data migration operation based on the corresponding priority level, is configured to initiate the data migration operation immediately after a completion of the scan operation based on determining that the corresponding priority level is greater than a priority level threshold.

8. The system of claim 1, wherein the processing device, to perform the data migration operation based on the corresponding priority level, is configured to initiate the data migration operation at a configured time after completion of the scan operation.

9. The system of claim 1, wherein the processing device, to determine to perform the data migration operation to move the data from the one or more memory segments of the memory device to the one or more other memory segments of the memory device, determines to perform the data migration operation based on a bit error count of the one or more memory segments being greater than or equal to a bit error count threshold.

10. The system of claim 1, wherein the data migration operation is a data folding operation.

11. A method comprising:

performing a scan operation to detect one or more errors in a memory block of a plurality of memory blocks of a memory device;

determining, based on a result of the scan operation, to perform a data migration operation to move data from one or more memory segments of the memory device to one or more other memory segments of the memory device, wherein the one or more memory segments of the memory device include at least one page of the memory block;

determining a corresponding priority level of a plurality of different priority levels of the data migration operation, wherein each of the plurality of different priority levels have different associated timings; and performing the data migration operation with a first timing based on the corresponding priority level when the memory device has performed fewer than a predetermined number of read or write operations, wherein the predetermined number is based on the corresponding priority level.

12. The method of claim 11, wherein the scan operation is a read disturb scan operation.

13. The method of claim 11, wherein determining the corresponding priority level of the data migration operation comprises determining whether the data migration operation is a high priority data migration operation or a low priority data migration operation, wherein the high priority data migration operation is initiated at a first time and the low priority data migration operation is initiated at a second time that is later than the first time.

14. The method of claim 13, wherein the high priority data migration operation is performed for a first set of memory segments of the memory block that failed the scan operation and the low priority data migration operation is performed for a remaining set of memory segments of the memory block that did not fail the scan operation.

15. The method of claim 13, further comprising switching from performing the low priority data migration operation to performing the high priority data migration operation based on detecting that a read count of the memory block is greater than or equal to a read count threshold.

16. A non-transitory computer-readable storage medium comprising instructions that, when executed by a processing device, cause the processing device to perform operations comprising:

performing a scan operation to detect one or more errors in a memory block of a plurality of memory blocks of a memory device;

determining, based on a result of the scan operation, to perform a data migration operation to move data from one or more memory segments of the memory device to one or more other memory segments of the memory device, wherein the one or more memory segments of the memory device include at least one page of the memory block;

determining a corresponding priority level of a plurality of different priority levels of the data migration operation, wherein each of the plurality of different priority levels have different associated timings; and performing the data migration operation with a first timing based on the corresponding priority level when the memory device has performed fewer than a predetermined number of read or write operations, wherein the predetermined number is based on the corresponding priority level.

17. The non-transitory computer-readable storage medium of claim 16, wherein the scan operation is a read disturb scan operation.

18. The non-transitory computer-readable storage medium of claim 16, wherein the processing device, to determine the corresponding priority level of the data migration operation, determines whether the data migration operation is a high priority data migration operation or a low priority data migration operation, wherein the high priority data migration operation is initiated at a first time and the low priority data migration operation is initiated at a second time that is later than the first time.

19. The non-transitory computer-readable storage medium of claim 18, wherein the high priority data migration operation is performed for a first set of memory segments of the memory block that failed the scan operation and the low priority data migration operation is performed for a remaining set of memory segments of the memory block that did not fail the scan operation.

* * * * *